(12) United States Patent
Bhaskaran

(10) Patent No.: US 10,268,963 B2
(45) Date of Patent: Apr. 23, 2019

(54) SYSTEM, METHOD, AND PROGRAM FOR SUPPORTING INTERVENTION ACTION DECISIONS IN HAZARD SCENARIOS

(71) Applicant: FUJITSU LIMITED, Kawasaki-shi, Kanagawa (JP)

(72) Inventor: Balakrishnan Bhaskaran, Exeter (GB)

(73) Assignee: FUJITSU LIMITED, Kawasaki (JP)

( * ) Notice: Subject to any disclaimer, the term of this patent is extended or adjusted under 35 U.S.C. 154(b) by 916 days.

(21) Appl. No.: 14/802,353

(22) Filed: Jul. 17, 2015

(65) Prior Publication Data
US 2016/0019463 A1   Jan. 21, 2016

(30) Foreign Application Priority Data
Jul. 17, 2014   (EP) ..................... 14177542

(51) Int. Cl.
*G06G 7/48* (2006.01)
*G06N 5/04* (2006.01)
*G06Q 10/06* (2012.01)
*G06F 17/50* (2006.01)

(52) U.S. Cl.
CPC ......... *G06N 5/045* (2013.01); *G06F 17/5009* (2013.01); *G06Q 10/0637* (2013.01)

(58) Field of Classification Search
None
See application file for complete search history.

(56) References Cited

U.S. PATENT DOCUMENTS

| | | | | |
|---|---|---|---|---|
| 8,655,595 B1* | 2/2014 | Green | .................... | G06Q 90/00 702/5 |
| 9,945,980 B2* | 4/2018 | Borger | ..................... | G01W 1/10 |
| 2006/0263152 A1* | 11/2006 | Conroy | .................... | E02D 1/00 405/303 |
| 2008/0133430 A1* | 6/2008 | Horowitz | ............... | G06Q 40/00 705/36 R |
| 2010/0100510 A1* | 4/2010 | Balaban | ................... | G06N 7/08 706/12 |

(Continued)

OTHER PUBLICATIONS

Basak et al. Multi-Agent Based Disaster Management System: A Review IJSCT vol. 2 Issue 2, Jun. 2011, pp. 343-348.*

(Continued)

*Primary Examiner* — Rehana Perveen
*Assistant Examiner* — Cuong V Luu
(74) *Attorney, Agent, or Firm* — Staas & Haley LLP

(57) ABSTRACT

A decision support system and method of assessing an intervention action in response to a hazard situation. The decision support system outputs information representing the hazard situation by combining data from data sources describing one of the hazard situation and a physical domain including at least one source of real-time data from the physical domain. A simulation is run using rules to predict the behavior of individual agents in response to the hazard situation, where the system selects one action from a set of candidate intervention actions based on the behavior predicted by the agent and tests the selected intervention action by initiating, for each of a predetermined set of possible outcomes of the selected intervention action, an operation to reiterate the simulation with a respective possible outcome as a factor influencing agent behavior.

14 Claims, 5 Drawing Sheets

(56) References Cited

U.S. PATENT DOCUMENTS

| | | | | |
|---|---|---|---|---|
| 2013/0317749 A1* | 11/2013 | Borger | .................... | G01W 1/10 702/3 |
| 2015/0324482 A1* | 11/2015 | Kato | .................... | H04L 41/145 707/798 |

OTHER PUBLICATIONS

Richard Dawson An Agent Based Model for Risk-Based Flood Incident Management Natural Hazards, 59(1), 2011, pp. 1-31.*

Gehbauer et al. The Disaster Management Tool (DMT) International Symposium on Strong Vrancea Earthquakes and Risk Mitigation, Oct. 2007 pp. 421-431.*

Markus et al. Concept for an INtegrated Disaster Management Tool 13th World Conderence on Earthquake Engineering, Aug. 2004, Paper No. 3094.*

Murty et al. A Coupled Hydrodynamic Modeling Syste for PHAILIN Cyclone in the Bay of Bengal Coastal Engineering 93, 2014 pp. 71-81.*

Mustapha et al. Modeling and Simulation Agent-Based of Natural Disaster Complex Systems Prodedia Computer Science 21, 2013, pp. 148-155.*

Sandhya et al. Wave Forecasting System for perational Use and Its Validation At Coastal Puducherry, East Coast of India Ocean Engineering 80, 2014, pp. 64-72.*

Woodward et al. Multiobjective Optimisation for Improved Management of Flood Risk ASCE Journal of Water Resources Planning and Management, 2012 pp. 1-35.*

Li Yin Agent-Based Simulations for Disaster Decision Support Journal of Security Education, vol. 1(4) 2006 pp. 169-175.*

Hawe et al. Agent-Based Simulation for Large-Scale Emergency Response: A Survey of Usage and Implementation ACM Computing Survey, vol. 45, No. 1, Article 8, Nov. 2012.*

Uno et al. Development of Simulation System for the Disaster Evacualtion Based on Multi-Agent Model Using GIS Tsinghua Science and Technology, ISSN 1007-0214 56/67 pp. 348-353, vol. 13, No. 51, Oct. 2008.*

Chen et al. Agen-Based Modeling and Analysis of Hurricane Evacuation Procedures for the Florida Keys Natural Hazards, 38: pp. 321-338, Springer 2006.*

European Search Report dated Jan. 15, 2015 in corresponding European application 14177542.9.

* cited by examiner ized European Application No. 14177542.9, filed Jul. 17, 2014, the disclosure of which is incorporated herein by reference.

SYSTEM, METHOD, AND PROGRAM FOR SUPPORTING INTERVENTION ACTION DECISIONS IN HAZARD SCENARIOS

CROSS REFERENCE TO RELATED APPLICATIONS

This application claims the benefit of European Application No. 14177542.9, filed Jul. 17, 2014, the disclosure of which is incorporated herein by reference.

BACKGROUND

1. Field

Embodiments relate to the field of disaster risk reduction and disaster response. In particular, an embodiment of the invention relates to a support system for assimilating data and modelling behaviour of agents in a hazard situation in order to determine how best to intervene.

2. Description of the Related Art

Disasters cannot be totally prevented. However, with the deployment of appropriate technologies and best practice methods, the disaster risks can be significantly reduced and the remaining residual risks can be effectively managed. A range of decision support systems are in place around the world to deal with a variety of disasters, ranging from earthquakes and volcanic eruptions to wild bushfires and disease transmission.

A typical decision support system for disaster risk reduction and management consists of three main components: hazard event simulation; disaster planning; and communications. The hazard event simulation component provides input to the disaster planning component. The disaster planning component primarily uses a variety of techniques and data to identify and evaluate risk by taking into account of hazard intensity, asset exposure, and vulnerability. The communication component uses the assessed risk and enables decision making based on the current policies, and communicates to the disaster risk management professionals for further action.

Although many decision support systems use a variety of databases to enable decision making, access to such databases for high speed data analysis in real-time is not enabled. In addition to this, disaster planning components primarily rely on subjective expert judgements based on the hazard predictions and risk evaluations. In these instances, no objective analytical models or simulations are employed, which may lead to defective decisions and hence increased disaster risk.

SUMMARY

Embodiments of the present invention include a decision support system for assessing an intervention action in response to a hazard situation in a physical domain, the decision support system comprising: a hazard simulator configured to generate and output information representing the hazard situation by combining data from a plurality of data sources describing the hazard situation and/or the physical domain including at least one source of real-time data from the physical domain; an agent based modeler configured to run a simulation using rules for predicting the behavior of agents affected by the hazard situation to predict the behavior of the individual agents in response to the hazard situation; a decision selector configured to select one from a set of candidate intervention actions in dependence upon the behavior predicted by the agent based modeler; an iterative decision tester configured to test the selected intervention action by, for each of a predetermined set of possible outcomes of the selected intervention action, initiating the agent-based modeler to reiterate the simulation with the respective possible outcome as a factor influencing agent behavior; an assessor configured to assess the behavior of the agents predicted by each iteration of the simulation to determine whether or not to initiate the intervention.

Embodiments provide a mechanism for combining data- and model-oriented decision support systems, incorporating data from a plurality of sources to determine whether or not to take particular intervention actions in case of a hazard situation. The iterative decision tester enables the potential effect of intervention actions on agent behavior to be analyzed, and the sensitivity of the intervention action to different possible outcomes to be assessed. The iterative decision tester leverages the assumption that behavior of individual agents in the domain being modeled will be influenced by whatever decision is taken, and so iterates through simulations which enable that influence to be analyzed and an appropriate intervention action selected accordingly.

Advantageously, the incorporation of real-time data from the physical domain ensures that the modeling is performed based on an up to date snapshot of a developing hazard situation. The rules for agent behavior are generated after taking into account the real-time data, so that the response of agents to the most recent predictions of how the hazard will progress can be accurately modeled.

The executed simulation is an agent based modeling simulation. The simulation is performed by modeling the behavior of individual agents and their interactions with one another in order to predict the behavior of the population of agents.

Each of the functional hardware elements may be executed by a processor including one or more computer processing units. The processor may be the same for each element or different processors may be employed for some or all of the elements.

The decision support system is configured to analyze a hazard situation in a physical domain using rules and modeling procedures in a simulation domain. The output is a determination of whether or not to initiate an intervention action in the physical domain. The output may further include initiating a selected intervention action in the physical domain. Such initiation may include communicating the selected intervention action to one or more recipients, raising alarms, affecting changes in signage, and/or broadcasting information corresponding to the decision to agents in the physical domain.

Each of the functional hardware elements may be realized by hardware configured specifically for carrying out the functionality of the element. The functional hardware elements may also be realized by instructions or executable program code which, when executed by a computer processing unit, cause the computer processing unit to perform the functionality attributed to the functional hardware element. The computer processing unit may operate in collaboration with one or more of memory, storage, I/O devices, network interfaces, sensors (either via an operating system or otherwise), and other components of a computing device, in order to realize the functionality attributed to the functional hardware element. The hardware elements may also be referred to as units, and may be steps or stages of a method, program, or process.

The decision support system may be realized by a single entity such as a computing device or server, or may be realized by more than one computing device operating collaboratively, for example, as a layer of a control protocol. Therefore, each functional hardware element may be executed by components belonging to a plurality of computing devices, and the functional hardware elements may be provided by more than one computing device.

Optionally, the hazard simulator comprises a federated database server configured to retrieve data from the plurality of data sources, and a data exploration engine configured to analyze the retrieved data in order to generate the information representing the hazard situation.

A number of different agencies may be responsible for storing and maintaining up to date data describing the physical domain and the hazard situation. Such data may be structured, unstructured, or semi-structured. The data may be in a number of different formats. Advantageously, a federated database wraps the data from the various sources, providing a single access point and data in a format or formats which are readable by the hazard simulator. The federated database server is a management system for data sources, but may not be responsible for storing the data itself. Rather, the data may be stored remotely and made available via APIs and other interfaces.

The data sources may also be referred to as data stores, databases, knowledge bases, or information sources, and may be managed or maintained by different agencies or entities. The data may be encrypted or otherwise protected and made available to the decision support system. Examples of data sources include the following:

a data source storing data representing the socio-economic properties of occupants of the physical domain;

a data source storing demographic information including types of house and/or annual income;

a data source storing data representing environmental conditions in the physical domain;

a data source representing the number and characteristics of one or more categories of agent in the physical domain;

a data source storing candidate intervention actions;

a data source storing a representation of geographical information in the physical domain including one or more of land surface, vegetation surface, river surface, ocean information including tides and/or wave heights, and air information including pollution and/or visibility;

a data source storing a representation of man-made structures in the physical domain;

a data source storing implementation options for each candidate intervention action; and a data source storing data representing hazard prediction information.

Once the data from the various sources have been used by the hazard simulator to generate information representing the hazard situation in the physical domain and the rules for agent behavior generated by the rule generator, a simulation is run by the agent based modeler. The result of the simulation is a prediction of agent behavior, which may be sufficient for a decision on which intervention to analyze further.

The agents whose behavior is predicted by the agent based modeler could include anything dynamic that in the physical domain that could respond to a situation. Examples include animals, vehicles, ships and aircrafts.

The decision selector may be configured to select more than one from the set of candidate intervention actions in dependence upon the behavior predicted by the agent based modeler. In addition, the iterative decision tester is configured to test each of the more than one selected intervention actions, and the assessor is configured to determine which one of the selected intervention actions to initiate based on the assessment of the behavior of the agents predicted by each iteration of the simulation.

It may be that the initial simulation does not provide sufficient information to determine to a required degree of confidence which of the candidate intervention actions will lead to the most favorable outcome, or which has the potential to lead to the most favorable outcome. Advantageously, selecting more than one intervention action for further testing by the iterative decision tester means that the final decision of which, if any, intervention action to take is based on a detailed analysis of the possible outcomes of each of more than one intervention action, so that the most effective intervention action can be accurately predicted. The assessor may be configured to use the same assessment metric for each of the more than one selected intervention actions and to select the intervention action performing best by that assessment metric.

Intervention actions may be considered in isolation in the simulation domain (in addition to any already being auctioned in the physical domain and therefore represented in the simulation domain) when being tested and assessed. Alternatively, it may be that there is some synergy between intervention actions, so that a combination of intervention actions has more benefit than may be realized by assessing each selected intervention action separately.

Optionally, the iterative decision tester is configured to test more than one of the selected intervention actions in combination with one another in iterations of the simulation.

Advantageously, such embodiments enable synergy between intervention actions to be predicted. Accordingly, the assessor is configured to assess the combinations and to identify when a combination of intervention actions is more favorable than any of the selected intervention actions in isolation. The iterative decision tester may be configured to find every permutation and/or combination of the selected intervention actions and test them, or it may be that certain combinations are stored in association with one another and hence identifiable as combinations for testing.

Each candidate intervention action may be implemented in a number of different ways. For example, if the intervention action relates to infrastructure then the infrastructure may be modified or implemented by a workforce internal to the physical domain or by an external workforce. Alternatively, if the intervention action is to evacuate a portion of the physical domain, then implementation options may include to which location people should be evacuated, by which means, and/or by which route.

Optionally, the iterative decision tester is configured to access a plurality of implementation options associated with the selected intervention action, and for each implementation option, to reiterate the simulation with each possible outcome, the respective implementation option and the respective possible outcome each being factors influencing agent behavior; and the assessor is configured to select an implementation option for the selected intervention action based on the assessment of the behavior of the agents predicted by each iteration of the simulation.

Advantageously, running simulations with each of a number of implementation options has the effect of the system gradually limiting to a decision as the simulations become more detailed. That is to say, in the first instance, an intervention action is selected based on a simulation of the agent behavior in response to the hazard situation. Then, once the intervention action is selected, the simulation becomes more detailed because the agent behavior is further constrained by one of the implementation options and the possible outcomes, and this enables the agent behavior to be predicted more accurately. On the basis of those simulations, an assessment is made by the assessor as to whether or how to implement the selected intervention action.

The implementation options for each intervention action may be stored locally as part of the decision support system or may be stored and maintained elsewhere and made available to the decision support system. In terms of a hierarchical structure, an implementation option is a child of an intervention action. Outcomes, on the other hand, are effects or consequences of the intervention action. Likelihoods of outcomes may be affected by the implementation option, and this may be taken into account by the assessor in comparing different implementation options.

Once a determination has been made as to which intervention action to take, and optionally how to implement it, the decision support system is configured to output the decision. For ease of reference, the decision is taken to mean an intervention action that it has been determined to initiate and optionally also the selected implementation option. The decision may be output in a number of ways. For example, the decision support system may include a communicator configured to output a representation of the intervention action determined to initiate by the assessor, and optionally the selected implementation option, to a user interface and/or one or more recipients and/or a signaling mechanism.

Advantageously, the communicator provides a mechanism for making the decision known to one or more parties, agencies, systems, or hardware devices, with a role to play in implementing the decision. The decision may be subject to veto or further processing or refinement by one or more recipients. Alternatively or additionally, the communicator may be configured to output the decision to a hardware device such as a signage system which can implement the decision by displaying appropriately generated messages, or by broadcasting appropriately generated messages to agents within the physical domain.

Optionally, the plurality of data sources includes an intervention action, and optionally the selected implementation option, previously determined to be initiated by the assessor, and the information output by the hazard simulator includes an indication of the intervention action determined to be initiated, and optionally the selected implementation option.

That is to say, the decision output by the decision support system may be included as an input to the hazard simulator, so that the information generated by the hazard simulator in making further decisions is made in consideration of intervention actions already taken. Advantageously, the decision support system thus provides a mechanism for continually taking intervention actions, monitoring the impact thereof on agent behavior and predicting future agent behavior based on that impact, and determining whether and which further intervention actions to take.

The assessor may be configured to assess the behavior of agents predicted by each iteration of the simulation by comparing the predicted behavior with one or more behavior goals and quantifying whether or not and/or the extent to which each of the behavior goals is satisfied by the predicted behavior.

The assessor may be configured to run an algorithm to generate a quantitative representation of the extent to which the behavior of agents predicted by a simulation is desirable, and hence to form a basis for comparison between different intervention actions and implementation options. The assessment may combine a measure of how desirable the predicted agent behavior is in each case with the likelihood of that case occurring (a case in this context being a combination of intervention action and/or implementation option and/or outcome) into a single metric. There may be a threshold minimum value of the metric which must be exceeded for an intervention action to be initiated.

The above assessment and metric value may be moderated, for example by cost of the intervention action. In particular, the assessor may be configured to obtain a representation of cost associated with the selected intervention action, and optionally each implementation option, and to include the cost as a factor in determining whether or not to initiate a selected intervention action and/or which implementation option to select.

The cost is not necessarily solely a financial cost but may take into account other factors such as potential for casualties and associated factors. In effect, the assessment performed by the assessor may be a cost benefit analysis.

The rule generator is configured to define rules governing the behavior of agents in the simulation. Generalized libraries of rules for behavior of different categories of agent may be available to the rule generator, and the rule generator is configured to access those libraries and to tailor and otherwise modify the rules stored therein for use in the particular simulation of the decision support system. For example, the rule generator may be configured to combine rule definitions from an external agent library with information output by the hazard simulator to generate an agent library specific to the hazard situation and the physical domain including the rules for predicting the behavior of agents affected by the hazard situation.

Advantageously, utilizing external libraries broadens the range of expertise incorporated into the modeling process, but the action of the rule generator ensures that the particular requirements of the hazard situation being modeled, the physical domain, and the agents concerned, are also inherent in the rules. Rules define how agents respond to the hazard situation and to the physical domain, and also how agents interact with one another.

Embodiments of another aspect of the present invention include a decision support method for assessing an intervention action in response to a hazard situation developing in a physical domain, the decision support method comprising: combining data from a plurality of data sources describing the hazard situation and/or the physical domain including at least one source of real-time data from the physical domain, and generating and outputting information representing the hazard situation at a point in time; using the output information output to generate rules for predicting the behavior of agents affected by the hazard situation; using an agent based modeling simulator to execute a simulation using the generated rules to predict the behavior of the agents in response to the hazard situation; selecting one from a set of candidate intervention actions in dependence upon the predicted behavior; testing the selected intervention action by, for each of a predetermined set of possible outcomes of the selected intervention action, initiating further simulations by the agent based modeling simulator with the respective possible outcome as a factor influencing agent behavior; assessing the behavior of the agents predicted by each iteration of the simulation and determining whether or not to initiate the intervention action.

Furthermore, embodiments of another aspect of the present invention include a computer program or suite of computer programs which, when executed by a computer or network of computers, cause the computer or network of computers to function as a system embodying the present invention.

Embodiments of another aspect of the present invention include a computer program or suite of computer programs which, when executed by a computer or network of computers, cause the computer or network of computers to perform a method embodying the present invention.

Although the aspects (software/methods/apparatuses) are discussed separately, it should be understood that features and consequences thereof discussed in relation to one aspect are equally applicable to the other aspects. Therefore, where a method feature is discussed, it is taken for granted that the apparatus embodiments include a unit or apparatus configured to perform that feature or provide appropriate functionality, and that programs are configured to cause a computing apparatus on which they are being executed to perform said method feature.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored there on a program for carrying out any of the methods described herein. A computer program embodying the invention may be stored on a computer-readable medium, or it could, for example, be in the form of a signal such as a downloadable data signal provided from an Internet website, or it could be in any other form.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
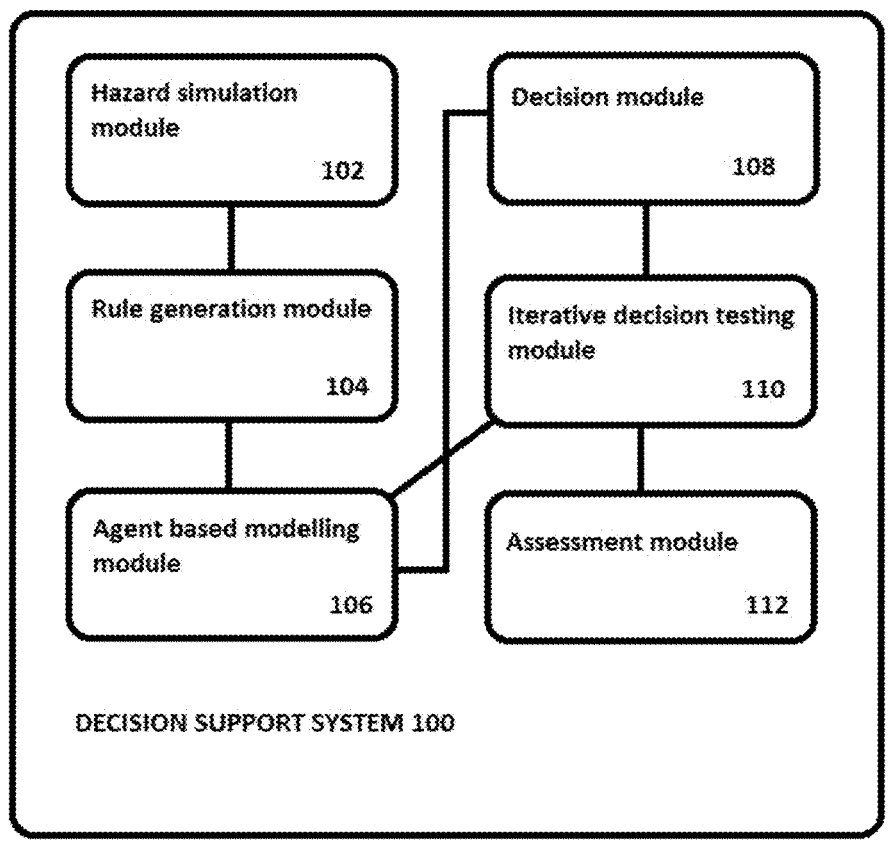
FIG. 1 illustrates a schematic diagram of a decision support system according to an embodiment.

FIG. 1 illustrates a decision support system 100 embodying the present invention. The functional hardware elements and the primary inputs/outputs of data and information between functional elements are illustrated. It should be understood that the transfer of information between functional elements is not restricted to those lines illustrated in FIG. 1, and that other flows of data may exist.

The hazard simulator 102 is configured to access data from a plurality of different sources and to use those data to generate information representing the hazard situation. The generated information may be a model of how the hazard situation is predicted to develop in the physical domain over a period of time, based on the most recently-available data from the plurality of sources. The hazard simulator 102 may comprise or have access to a hazard prediction engine configured to predict the evolution of hazards over time. The hazard situation may be an event taking place over a period of time in the physical domain that poses a danger or a risk to agents within the physical domain, whether those agents be people, animals, business units, or processes. The hazard simulator 102 analyses the data from the different sources in order to generate the information, this process may also be referred to as exploration. The hazard simulator 102 analyses the data from the plurality of data sources using data analytics tools. For example, in a flood emergency situation, the hazard simulator 102 may employ a geographical information system (GIS) to map potential inundation areas using a source of flood forecasting information combined with a digital elevation model. Combining this inundation information with the demographic data and local infrastructure information using the GIS tool, information is generated which provides insight into agent behavior, and thus provides a basis for rule generation. For example, the physical domain may be a low-lying area populated by daily wage laborers living in poor housing with no sufficient resilience to surface flooding. In this scenario, even a moderate rain persisting for a few hours could lead to severe disruption and damage to lives and assets. The hazard simulator 102 provides this insight about the people and business agents in response to the flooding situation. Such information provides a basis for rules to be established which describe agent behavior.

The rule generator 104 exploits the information generated by the hazard simulator 102 to set rules for agent behavior, in the context of a simulation of agent behavior in the physical domain in response to the hazard situation. Some generalized rules for agent behavior may be available to the rule generator 104 from an external library, however embodiments tailor the generalized rules for the specific physical domain and hazard situation represented by the information output by the hazard simulator 102. Furthermore, it may be that there are agent types or agent behaviors specific to the physical domain, which would not be adequately modeled by generalized rules. Information regarding the population of the physical domain in terms of agents may be stored locally or remotely and made available to the hazard simulator 102 and/or the rule generator 104.

Agent based modeling is a procedure for predicting the behavior of a population of agents by modeling individual agents autonomously. Advantageously, agent based modeling models the interactions between individuals, which interactions can be particularly important in hazard situations. Hence, agent based modeling is selected as the simulation mechanism in embodiments. Rules are set to govern the behavior of individual models and their interactions. The rules may be somewhat probabilistic, so that certain aspects of behavior are represented by probability distributions, wherein outcomes are generated by the simulator. The agent based modeler 106 may be configured to execute a simulation program or simulator which uses the rules and the physical domain and hazard situation (the physical domain and hazard situation are represented in this context by described by the information output by the hazard simulator 102) to predict the individual behavior of each agent and therefore to predict the behavior of the population of agents. Alternatively, the agent based modeler 106 may execute the simulation remotely, so that it provides input parameters and rules to an HPC or other system not forming part of the decision support system 100 that runs the simulations and provides results in the form of a prediction of agent behavior to the decision support system 100. Due to the high number of interactions between agents which may occur, the computing requirements of running simulations using agent based modeling can be very high, and hence specialized systems can be employed which have access to processing resources which are specialized for processing at a very high rate, and would not be appropriate for the remainder of the functionality of the decision support system 100. Hence, the simulator itself may be an external component accessible by the agent based modeler 106. The agent based modeler 106 is configured to run an initial simulation based on the intervention actions already taken (if any) in order to determine what the next intervention action should be, and then to run subsequent iterations as instructed by the iterative decision tester 110, to refine and analyze the determined next intervention action. The output of the agent based modeler 106 is a prediction of the behavior of the modeled agents in response to the hazard situation. This prediction could take the form of a set of statistics, properties, and/or values summarizing the predicted behavior.

The decision selector 108 is configured to analyze the prediction of behavior output of agents output by the agent based modeler 106 in order to determine which of a predetermined set of intervention actions to take, or to select for further analysis. By predetermined, it is meant that there is a finite set of known intervention actions (candidate intervention actions), which may be stored as part of the system 100 or stored remotely and made accessible to the system 100. An algorithm or some other form of analysis may be performed to determine which of the candidate intervention actions is most appropriate to the hazard situation, physical domain, and predicted agent behavior. For example, the predicted agent behavior may be output in a form in which it is possible to predict, for each candidate intervention action, a range of potential effect on agent behavior, and thus to identify and select the candidate intervention action with the potential for the most positive effect. Other or additional forms of analysis may be implemented, for example, particular characteristics of agent behavior may make certain candidate intervention actions particularly suitable and others unsuitable. For example, if motor travel is predicted to be undertaken by a large number of agents, then re-routing traffic via road closures and signage will be a more suitable intervention action than, for example, providing additional trains or buses. The set of candidate intervention actions may be limited in the first place by characteristics of the physical domain and the hazard situation, and the decision selector 108 configured to select from the set of candidate interventions so limited.

The iterative decision tester 110 is configured to test the selected intervention action by, for each of a predetermined set of possible outcomes of the selected intervention action, initiating the agent-based modeler 106 to iterate the simulation with the respective possible outcome as a factor influencing agent behavior. Although it may be possible to predict a range of effects on agent behavior for each candidate intervention action by the decision selector 108, more accurate predictions can be made by reiterating the agent based modeling with the selected intervention action included as a constraint on the agent behavior. The sensitivity of the intervention action to different possible outcomes can be investigated in this manner. For example, if the intervention action is to route traffic in a particular direction, two possible outcomes may include the road remaining open, or the road being forced to close by some event. The effect of these outcomes on agent behavior can be investigated and agent behavior predicted for each outcome. The iterative tester 110 takes into account the effect that a selected intervention action may have on agent behavior, and the effect that the agent behavior has on the intervention action to select. The number of iterations will depend on the implementation details of the embodiment, but factors may include granularity of outcomes being considered, the requirements of the analysis process undertaken by the assessor 112, and availability of hardware resources to the agent based modeler 106 carrying out the iterations. The iterative decision tester 110 may be considered to be a controller which determines/selects/generates input parameters for the agent based modeler 106 and instructs or requests the agent based modeler 106 to run simulations with said input parameters. The output of the iterative decision tester 110 is therefore input parameters and/or instructions/requests for the agent based modeler 106. In addition, the iterative decision tester 110 may be configured to gather the results of the instructed/requested simulations and to output them (possibly in a processed form) to the assessor 112. Alternatively, the results of the simulations instructed/requested by the iterative decision tester 110 may be output by the agent based modeler 106 directly to the assessor 112.

The assessor 112 is configured to analyze the agent behavior predicted by the agent based modeler 106 for the different outcomes of the selected intervention action and to determine whether or not to initiate the intervention action in the physical domain. It may be that, if it is determined not to initiate the intervention action, the assessor 112 instructs the decision selector 108 to select a different intervention for testing. Alternatively or additionally, it may be that the assessor 112 determines that the selected intervention action cannot be initiated until one or more other candidate intervention actions have been selected and tested, as a basis for comparison, before one or more are selected to initiate. The form of the analysis undertaken by the assessor 112 will depend on the implementation details of the embodiment, but may take the form of a comparison of the predicted behavior of agents with one or more behavior goals. The predicted behavior of each iteration of the agent based modeler 106 instructed by the iterative decision tester 110 may be assessed individually and then the results of the analysis combined to form an overall assessment of the selected intervention action. The combination of individual assessments may include weighting the individual assessment based on the likelihood of the outcome to which it corresponds. The assessment may be a cost benefit analysis in which the cost of the intervention action is compared with its effect on agent behavior in order to determine whether or not to initiate the selected intervention action. If the assessment meets criteria, then it is determined to initiate the selected intervention action. Such initiation may include generating an alert or signal for transmission to one or more recipients, or to implement indications on configurable electrical signs or other forms of configurable display.

Figure 2:
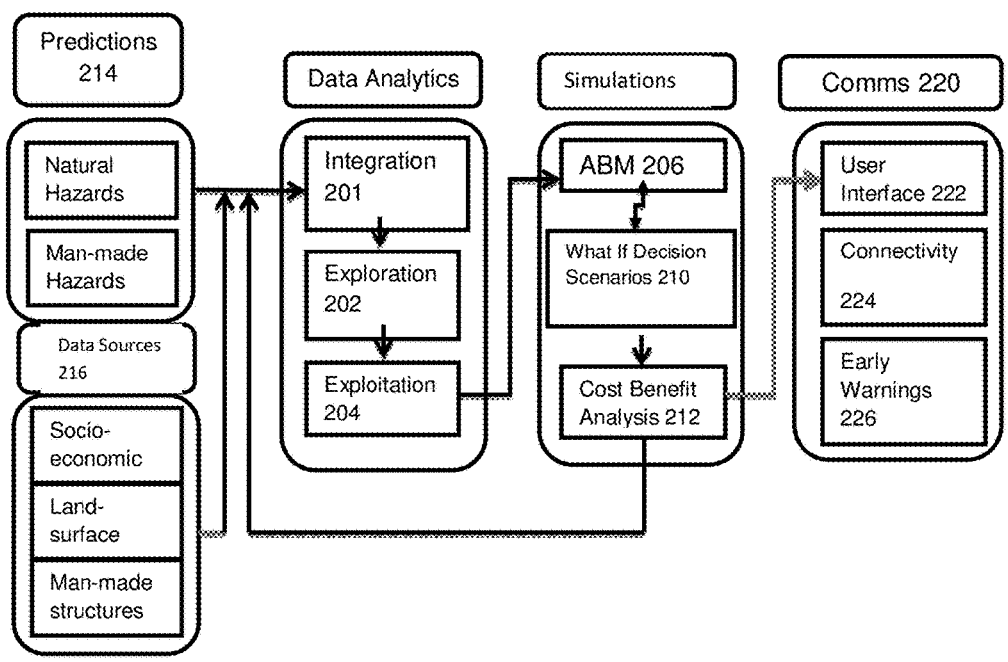
FIG. 2 illustrates a schematic diagram of a decision support system according to another embodiment.

FIG. 2 illustrates an example of a decision support system 200 embodying the present invention. The decision support system 200 is triggered by the prediction of a natural or man-made hazard, which predictions are exemplary of data sources describing a hazard situation. The predictions component 214 may be included as a component of the decision support system or may be external and accessible to the decision support system 200. The predictions component 214 is configured to provide predictions of how an ongoing hazard situation will change with respect to time. For example, in the case of a man-made hazard such as a large-scale gas leak from an industrial site, to better understand the particle dispersion (speed and direction), or in the case of a natural hazard such as a flood, to describe the rates and directions of water flow.

The data integration component 201 is exemplary of the federated database server mentioned elsewhere in this document, and combines data representing the hazard situation and physical domain from a plurality of data sources 216 and prediction sources 214 (wherein prediction sources are a specific form of data source). The data integration component 201 is configured to integrate structured, semi-structured, and/or unstructured data from multiple sources (sources including particular data locations, agencies, or software packages), and make those data available for data exploration by the data exploration component 202. For example, in the case of the hazard situation being a flood situation, the data integration component 202 may integrate data representing environment (e.g. land-cover, rivers and canals), terrain, socio-economic (e.g. annual income and types of assets and livelihoods) and flood defense information, along with flood forecasts on an on-demand basis for the physical domain. The sources of this data may reside at various locations ranging from government departments to insurance and re-insurance agencies, and some may be available from components internal to the decision support system 200. The data integration component enables access to these distributed databases for rapid analysis. The data integration component makes data available to the data exploration component 202 for analysis. The data integration component 201 and the data exploration component 202 are collectively exemplary of the hazard simulator 102.

The data exploration component 202 is configured to run data analytics tools that explore the data that was made available by the data integration component 201. The analytics tools convert the raw data from the multiple sources into a coherent description of the hazard situation in the physical domain and predictions of how it will develop over time. The data exploration component 202 provides a high-throughput interface to perform rapid analysis in real-time to generate knowledge and insights from the data that are made available to other components of the decision support system 200.

The information output by the data exploration component 202 is analyzed by the data exploitation component 204. The data exploitation component 204 is exemplary of the rule generator mentioned elsewhere in this document. The data exploitation component 204 is configured to exploit the knowledge generated by the data integration exploration component 202, and to prepare behavior rules for the agents in an agent-based modeling system which is used to develop and test sensitivity of decisions regarding intervention actions.

An agent based modeling system 206 is exemplary of the agent based modeler 106 and the decision selector 108. The agent based modeling system is configured to model the behavior of the individuals, animals, vehicles, business units, or commodity transactions as categories of agent within the physical domain, using timing, event ordering or individual behavior. Computational requirements will increase proportionally with increases in the number of agents to be modeled. In cases in which there are a large number of agents to be modeled within the physical domain, a large number of behaviors will be defined and solved. It may be that the agent based modeling system 206 is itself a high performance computing system, or is configured to provide inputs to a high performance computing system external to the decision support system 200 in order to perform simulations.

The simulations executed by the agent based modeling system 206 serve to understand and predict the behavior of the modeled agents (for example, individuals) in a complex environment for a given trigger, for example, an approaching flood. The predicted behavior of the individuals (for example, the majority of the people may decide to move to the northern part of the city) obtained from these simulations will then be passed on to the what if decision scenario component 210 which is configured to enlist the agent based modeling system 206 to test whether particular intervention actions have a desirable impact on disaster risk reduction decision, by modeling, for example, the process of building temporary flood defense system in the northern part of the city. The agent rules for the what if decisions scenario component 210 could be defined by the availability of the workforce and the suitability of the location for building the flood defense etc. A variety of what if decision scenarios could then be considered and an optimum decision could be arrived. The what if decision scenario component 210 is exemplary of the iterative decision tester 110.

The decision, having been first made by the agent based modeling system 206 and then refined by the what if decision scenario component 210 and assessed by the cost benefit analysis component 212, is then fed back to the data exploration component 202 via the data integration component 201. At the data exploration component 202, the latest predictions from the predictions component 214 are used to review the extent of the hazard, in conjunction with the latest projected changes in environmental conditions (e.g. changes in land configuration through satellite observations) and the action decided upon by the cost benefit analysis component 212, to produce new information describing the hazard situation in the physical domain. This process can be iterated a number of times to re-evaluate and fine tune the decisions and to add new decisions to those already taken. The feeding back of the decision enables the integration of simulation results along with other environmental and socio-economic information for analytics to refine and improve the decision making process. This allows the assimilation of real-time information (e.g. satellite observations) into the decision making process.

When the decision is passed back to the start of the data analytics, the time-dependent nature of other relevant parameters is considered in the context of the decision. For example, changes in flood forecast could provide a new piece of information which indicates that a new intervention action should be taken. The decision support system is then configured to repeat the steps leading to a decision and to pass the new decision to the communicator 220 or to initiate the new decision in some other way. For example, a decision such as closing off a tunnel will influence agent behavior, and possibly also the physical domain. Hence, feeding the decision back to the data integration component enables future simulations to reflect the latest state of the hazard situation and physical domain. There may be limitations imposed on new decisions and their allowable convergence to previously made decisions.

Once the simulations performed by the agent based modeling system 206 under instruction from the what if decision scenario component 212 have been analyzed by the cost benefit analysis component 212 and a decision (an intervention action to initiate in the physical domain optionally along with an implementation option) reached as to what action to take in the physical domain, the decision is communicated to the communicator 220. The communicator 220 may include one or more of a user interface 222, connectivity to the internet or a mobile network 224, and an early warning message component 226. The user interface 222 is configured to present the decision to a user who may possess the authority to veto the decision and/or to put the decision into effect in the physical domain. The connectivity to the internet or a mobile network 224 may be configured to broadcast the decision to agents in the physical domain or to selected (e.g. emergency service) personnel in the physical domain. The early warning message component 226 may be configured to communicate messages regarding the hazard situation and/or the decision to people in the physical domain through signage, media, or other traditional or specialized cellular networks.

Figure 3:
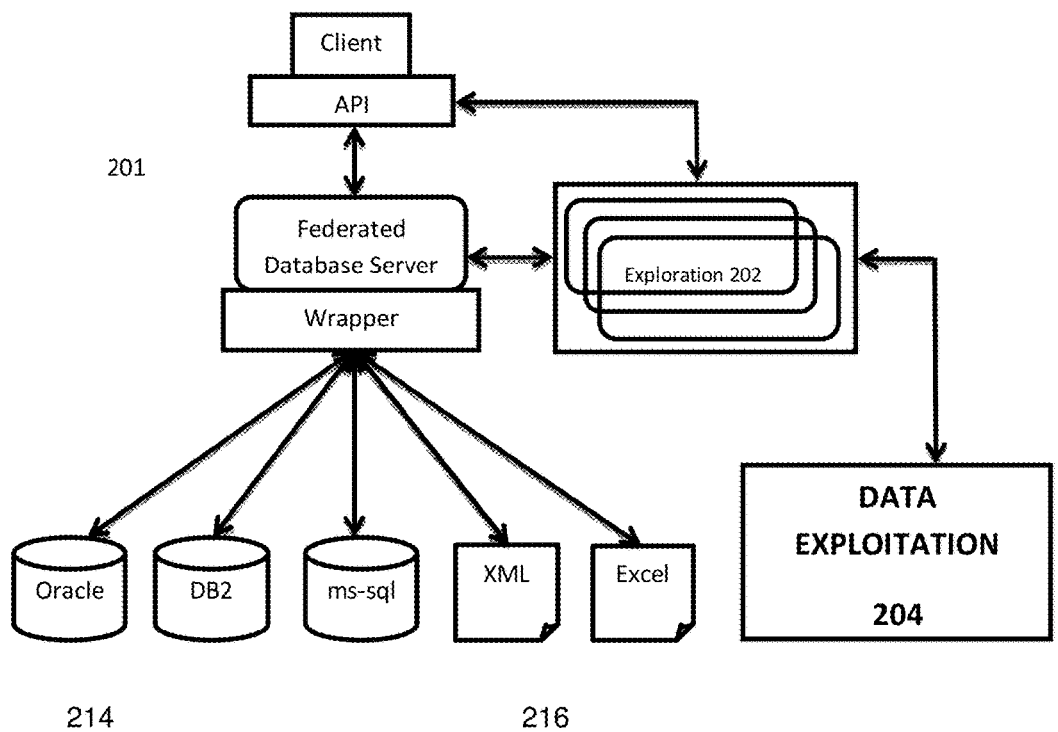
FIG. 3 illustrates an exemplary architecture of data analytics components.

FIG. 3 illustrates an exemplary architecture of the data analytics components. In the context of the example of FIG. 1, the architecture of FIG. 3 is exemplary of the hazard simulator 102 and the rule generator 104. In the context of the example of FIG. 2, the architecture of FIG. 3 is exemplary of the data integration component 201, the predictions component 214, the data sources 216, and the data exploration 202 and data exploitation components 204. For ease of reference, the reference signs in FIG. 3 correspond to the context of the example of FIG. 2.

A client node accesses a federated database server via an API. The federated database server wraps data from a plurality of sources 214, 216. The client node, API, federated database server, and wrapper, collectively correspond to the data integration component. The client node and API are optional, since the data exploration component 202 may access the federated database server directly. The data exploration component 202 is one or more analytical tools (algorithms and other processing platforms) running on a computing processor and configured to combine data from the plurality of data sources into information describing the hazard situation in the physical domain and to predict its evolution over a time period. The data exploitation component 204 is configured to utilize the information generated by the data exploration component to define rules governing behavior of agents in the simulation domain.

The data integration component 201 enables high-speed data analytics in real time. In order to achieve this, a variety of structured, semi-structured and unstructured data sources describing socio-economic, environmental and hazard prediction information are accessed. The federated database system is particularly suited for this purpose.

Figure 4:
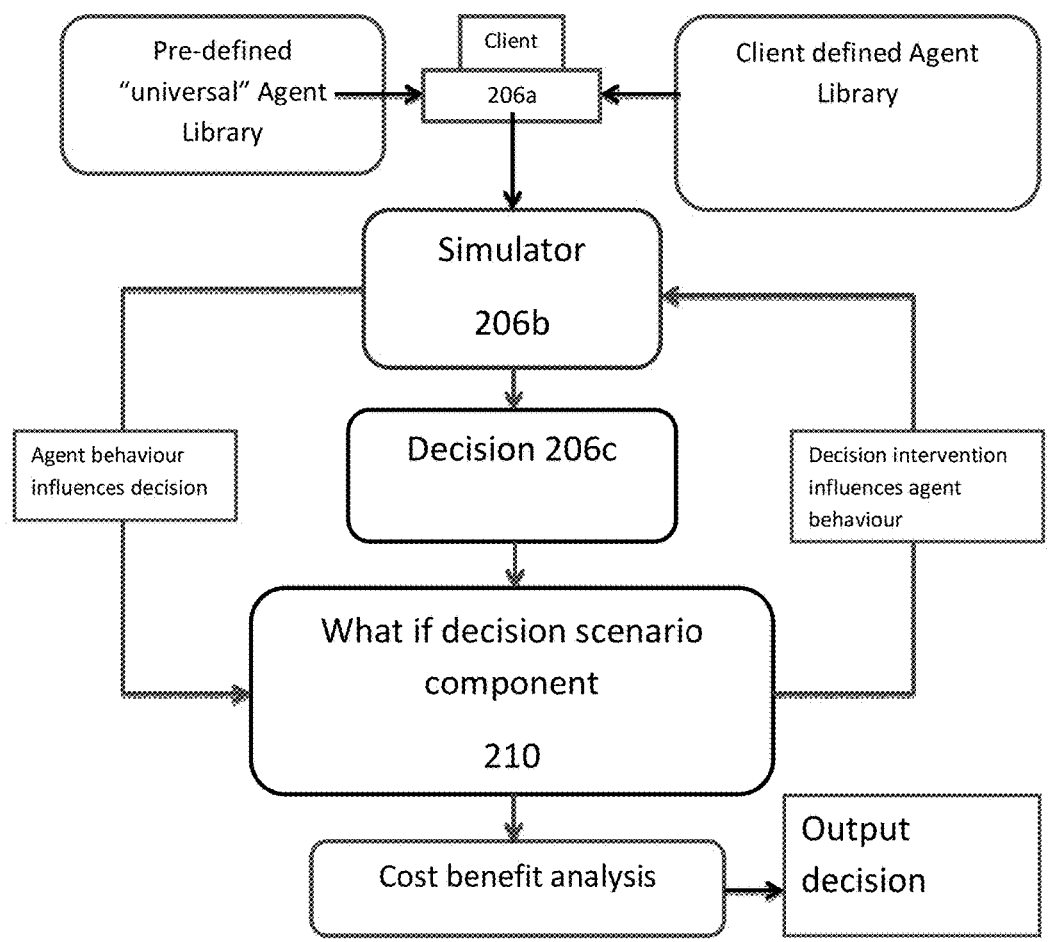
FIG. 4 illustrates functionality of simulation components.

FIG. 4 illustrates the functionality of the simulations components. In the context of the example of FIG. 2, the simulations components include the agent based modeling system 206, the what if decision scenarios component 210, and the cost benefit analysis component 212. In the context of the example of FIG. 1, the simulations components include the agent based modeler 106, the decision selector 108, the iterative decision tester 110, and the assessor 112.

As illustrated in FIG. 4, the agent based modeling system includes a client component 206a configured to compile rules governing agent behavior from sources including a pre-defined agent library, for example, GIS-mapping functions for a flooding hazard, and from an agent library defined for the particular hazard and physical domain being modeled, as provided by the data exploitation component 204 or rule generation component 104.

The simulator 206b is configured to simulate the response of agents to the hazard situation and the interactions between agents in order to generate a prediction of the behavior of the overall agent population. The simulator 206b may be a component of the decision support system or may be an external high performance computing application. The agents modeled by the simulator component 206b may include individual people, vehicles, animals, products, services, and processes from the physical domain. The simulator 206b primarily uses agent based modeling (ABM). ABM is used to predict the behavior of individuals in the hazard situation, for example, a flood disaster. The predicted behavior may be, for example, to travel to particular regions of the physical domain. Based on this, a decision is taken by the decision component 206c.

The decision component 206c is configured to select an intervention action from a set of candidate intervention actions in dependence upon the behavior predicted by the simulation component. For example, if the predicted behavior is that individuals travel to particular regions of the physical domain, the selected intervention action may be to build temporary flood defenses or relief camps in the particular regions. These processes may be implemented in one or more ways. For example, deploying internal versus external workforce, and which locations to choose. These different implementations are assessed with what if scenarios using the what if decision scenario component 210 and the simulator 206b. An iterative loop then ensues in which the what if decision scenario component 210 initiates further simulations with different outcomes of the intervention action as factors influencing agent behavior in order to determine whether or not to take the selected intervention action. The iterations may also be repeated for each of a number of different implementation options of the intervention action. The what if decision scenario component 210 investigates how different outcomes of the intervention action might change agent behavior. For example, if a flood defense is built, the predicted behavior might be that more people move behind the defense, but an outcome might be that the defense is breached, and so on. The building and breaching of the flood defense are examples of processes that can be modeled as agents by the simulator. Hence, the agents in the simulation could included processes.

The sensitivity of the decision is tested, and the behavior predicted by the simulator component 206c for each decision (being an intervention action or combination of intervention action and implementation option) monitored by the cost benefit analysis component 212 which is configured to find the optimal decision. The assessment criteria used by the cost benefit analysis component 212 will depend upon the particular requirements of the embodiment, but may include comparing the predicted behavior with one or more desired behaviors, and quantifying the extent to which the predicted behavior matches each of the one or more desired behaviors. Such quantification can be moderated by a factor representing cost and the result used a basis for ranking decisions with a view to selecting the top ranking decision as the optimal decision. Once a decision has been made in terms of which intervention action to initiate (and how), the decision is passed on to the communicator 220 and to the data integration component 201.

Figure 5:
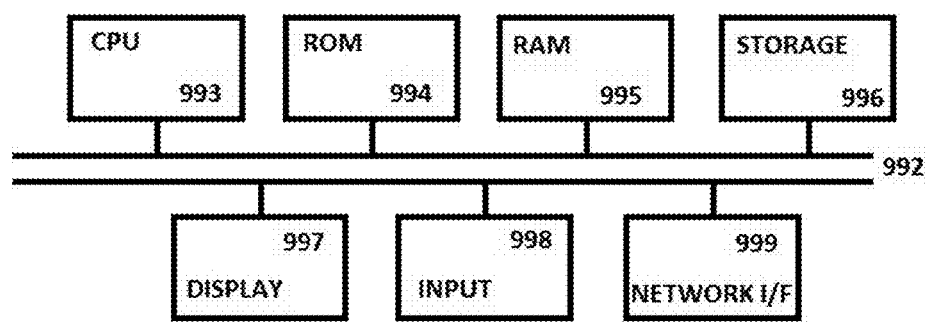
FIG. 5 illustrates an exemplary implementation.

FIG. 5 is a block diagram of a computing device, such as a server or PC, which embodies the present invention, and which may be used to implement a method of an embodiment. The computing device comprises a computer processing unit (CPU) 993, memory, such as Random Access Memory (RAM) 995, and storage, such as a hard disk, 996. Optionally, the computing device also includes a network interface 999 for communication with other such computing devices of embodiments. For example, an embodiment may be composed of a network of such computing devices. Optionally, the computing device also includes Read Only Memory 994, one or more input mechanisms such as keyboard and mouse 998, and a display unit such as one or more monitors 997. The components are connectable to one another via a bus 992.

The CPU 993 is configured to control the computing device and execute processing operations. The RAM 995 stores data being read and written by the CPU 993. The storage unit 996 may be, for example, a non-volatile storage unit, and is configured to store data.

The display unit 997 displays a representation of data stored by the computing device and displays a cursor and dialog boxes and screens enabling interaction between a user and the programs and data stored on the computing device. The input mechanisms 998 enable a user to input data and instructions to the computing device.

The network interface (network I/F) 999 is connected to a network, such as the Internet, and is connectable to other such computing devices via the network. The network I/F 999 controls data input/output from/to other apparatus via the network.

Other peripheral devices such as microphone, speakers, printer, power supply unit, fan, case, scanner, trackerball etc may be included in the computing device.

The decision support system may be embodied as functionality realized by a processor (CPU) of a computing device such as that illustrated in FIG. 5. The functionality of the decision support system may be realized by a single computing device or by a plurality of computing devices functioning cooperatively via a network connection. An apparatus of an embodiment may be realized by a computing device having the hardware setup shown in FIG. 5. Methods embodying the present invention may be carried out on, or implemented by, a computing device such as that illustrated in FIG. 5. One or more such computing devices may be used to execute a computer program of an embodiment. Computing devices embodying or used for implementing embodiments need not have every component illustrated in FIG. 5, and may be composed of a subset of those components. A method embodying the present invention may be carried out by a single computing device in communication with one or more data storage servers via a network.

The hazard simulator may comprise processing instructions stored on a storage unit 996, a processor 993 to execute the processing instructions, and a RAM 995 to store information objects during the execution of the processing instructions.

The agent based modeler may comprise processing instructions stored on a storage unit 996, a processor 993 to execute the processing instructions, and a RAM 995 to store information objects during the execution of the processing instructions. The agent based modeler may further comprise an external library, or a link to an external library, storing generalized modeling rules.

The iterative decision tester may comprise processing instructions stored on a storage unit 996, a processor 993 to execute the processing instructions, and a RAM 995 to store information objects during the execution of the processing instructions.

The assessor may comprise processing instructions stored on a storage unit 996, a processor 993 to execute the processing instructions, and a RAM 995 to store information objects during the execution of the processing instructions.

The rule generator may comprise processing instructions stored on a storage unit 996, a processor 993 to execute the processing instructions, and a RAM 995 to store information objects during the execution of the processing instructions.

The decision selector may comprise processing instructions stored on a storage unit 996, a processor 993 to execute the processing instructions, and a RAM 995 to store information objects during the execution of the processing instructions.

The iterative decision tester may comprise processing instructions stored on a storage unit 996, a processor 993 to execute the processing instructions, and a RAM 995 to store information objects during the execution of the processing instructions.

The communicator may comprise processing instructions stored on a storage unit 996, a processor 993 to execute the processing instructions, and a RAM 995 to store information objects during the execution of the processing instructions.

Embodiments enable rapid objective decision making in real-time to reduce disaster risks and manage any unavoidable risks. The accuracy and credibility of the decision support system would encourage, for example, insurance and re-insurance industries to take pro-active measures such as procuring and supplying flood defense equipments in case of flood disasters. This will have the potential to save millions of dollars and lives, and keep the future insurance premiums under control. Furthermore, the application of embodiments is not limited to only short-term responses to disaster situations. Embodiments can be applied to long term strategic planning for responding to hazards, such as reforestation efforts, as well as short term tactical decisions such as the application of pesticides in forms.

What is claimed is:

1. A decision support system assessing an intervention action in response to a hazard situation developing in a physical domain, the decision support system comprising:
   a processor; and
   a memory having instructions stored therein which, when executed by the processor, cause the processor to:
      generate and output information representing the hazard situation by combining data from a plurality of data sources describing one of the hazard situation and the physical domain including at least one source of real-time data from the physical domain,
      run an agent-based simulation using rules generated based on behavior of agents in the physical domain that are affected by the hazard situation to predict a behavior of the agents, individually, in response to the hazard situation, the rules being generated by linking the real-time data from the physical domain with data associated with respective cellular devices of the agents affected by the hazard situation,
      select an intervention action from a set of candidate intervention actions in dependence upon the behavior of the agents predicted,
      test the selected intervention action, for each of a predetermined set of possible outcomes of the selected intervention action, by initiating a reiteration of the agent-based simulation with a respective possible outcome as a factor influencing agent behavior,
      assess the behavior of the agents predicted by each iteration of the agent-based simulation to determine whether to initiate the selected intervention action, and
      generate an alert to initiate the selected intervention action for transmission to recipients in the physical domain, when the selected intervention action is determined to be initiated,
   wherein the decision support system is enabled to broadcast the generated alert to the recipients in the physical domain through a cellular communication network connected with the decision support system by utilizing the real-time data from the physical domain and a connection to the cellular communication network.

2. A decision support system according to claim 1, wherein the instructions stored in the memory, when executed by the processor, cause the processor to:

use the information output to generate rules for predicting the behavior of the agents affected by the hazard situation.

3. A decision support system according to claim 1, wherein the decision support system further comprises:
a federated database server configured to retrieve data from the plurality of data sources, and
a data exploration engine configured to analyze the retrieved data in order to generate the information representing the hazard situation.

4. A decision support system according to claim 3, wherein the plurality of data sources includes one or more of the following:
a data source storing date representing socio-economic properties of occupants of the physical domain;
a data source storing data representing environmental conditions in the physical domain;
a data source storing candidate intervention actions including the set of candidate intervention action selected;
a data source storing a representation of geographical information in the physical domain including one or more of land surface information, vegetation surface information, river surface information, ocean information including information of at least one of a tide, a wave height, and air information including pollution and visibility;
a data source storing a representation of man-made structures in the physical domain;
a data source storing implementation options for each candidate intervention action; and
a data source storing data representing hazard prediction information.

5. A decision support system according to claim 1, wherein the selected intervention action is a first intervention action, and the processor is configured to select a second intervention action from the set of candidate intervention actions in dependence upon the behavior predicted,
test the selected intervention action includes testing of the first intervention action and the second intervention action, and
determine which one of the first intervention action and the second intervention action to initiate based on assessment of the behavior of the agents predicted by each iteration of the agent-based simulation.

6. A decision support system according to claim 5, wherein the test by the processor includes testing the first intervention action in combination with the second intervention action in iterations of the agent-based simulation.

7. A decision support system according to claim 1, wherein the test by the processor of the selected intervention action includes:
accessing a plurality of implementation options associated with the selected intervention action, and for each implementation option, reiterating the agent-based simulation with each possible outcome, the respective implementation option and the respective possible outcome each being factors influencing agent behavior; and
the assessing includes selecting an implementation option for the selected intervention action based on the assessment of the behavior of the agents predicted by each iteration of the agent-based simulation.

8. A decision support system according to claim 1, wherein the plurality of data sources includes an intervention action, and a previously determined implementation option to be initiated, and the information output includes an indication of the previously determined intervention action, and a corresponding implementation option.

9. A decision support system according to claim 1, wherein the assessing includes assessing the behavior of the agents predicted by each iteration of the agent-based simulation by comparing the predicted behavior with one or more behavior goals and quantifying whether each of the behavior goals is satisfied by the predicted behavior.

10. A decision support system according to claim 1, wherein the assessing includes obtaining a representation of cost associated with the selected intervention action, and each implementation option, where cost information is included as a factor in determining whether to initiate the selected intervention action and/or which implementation option to select.

11. A decision support system according to claim 1, wherein the instructions stored in the memory, when executed by the processor, cause the processor to:
combine rule definitions from an external agent library with the information output to generate an agent library specific to the hazard situation and the physical domain including the rules for predicting the behavior of the agents affected by the hazard situation.

12. A decision support method for assessing an intervention action in response to a hazard situation developing in a physical domain, the decision support method comprising:
generating and outputting information representing the hazard situation by combining data from a plurality of data sources describing the hazard situation and/or the physical domain including at least one source of real-time data from the physical domain;
generating rules, using the output information, based on behavior of agents in the physical domain that are affected by the hazard situation to predict a behavior of the agents, the rules being generated by linking the real-time data from the physical domain with data associated with respective cellular devices of the agents affected by the hazard situation;
executing an agent-based simulation using the rules generated to predict the behavior of the agents affected by the hazard situation to predict the behavior of the agents, individually, in response to the hazard situation;
selecting an intervention action from a set of candidate intervention actions in dependence upon the predicted behavior of the agents;
testing the selected intervention action, for each of a predetermined set of possible outcomes of the selected intervention action, by initiating a reiteration of the agent-based simulation with a respective possible outcome as a factor influencing agent behavior;
assessing the behavior of the agents predicted by each iteration of the agent-based simulation and determining whether to initiate the selected intervention action;
generating an alert to initiate the selected intervention action for transmission to recipients in the physical domain, when the selected intervention action is determined to be initiated in the determining; and
broadcasting the generated alert to the recipients in the physical domain through a cellular communication network connected with a decision support system that uses the decision support method by utilizing the real-time data from the physical domain and a connection to a cellular communications network.

13. A non-transitory computer readable storage medium storing a computer program which, when executed by a computing apparatus, causes the computing apparatus to function as the decision support system of claim 1.

14. A non-transitory computer readable storage medium storing a computer program which, when executed by a computing apparatus, causes the computing apparatus to perform the method of claim 12.

* * * * *